United States Patent
Neuman

(10) Patent No.: US 9,870,529 B1
(45) Date of Patent: Jan. 16, 2018

(54) TRANSPONDER WIRE BONDED TO ROUND WIRE ON ADHESIVE TAPE HAVING A WATER-SOLUBLE BACKING

(71) Applicant: AUTOMATED ASSEMBLY CORPORATION, Lakeville, MN (US)

(72) Inventor: Robert Neuman, Cannon Falls, MN (US)

(73) Assignee: Automated Assembly Corporation, Lakeville, MN (US)

( * ) Notice: Subject to any disclaimer, the term of this patent is extended or adjusted under 35 U.S.C. 154(b) by 0 days.

(21) Appl. No.: 15/416,664

(22) Filed: Jan. 26, 2017

(51) Int. Cl.
G06K 19/06 (2006.01)
G06K 19/077 (2006.01)
H05K 1/18 (2006.01)
H05K 1/11 (2006.01)
H05K 3/40 (2006.01)
H05K 3/32 (2006.01)
H05K 3/28 (2006.01)

(52) U.S. Cl.
CPC ... G06K 19/0775 (2013.01); G06K 19/07747 (2013.01); H05K 1/111 (2013.01); H05K 1/181 (2013.01); H05K 3/28 (2013.01); H05K 3/32 (2013.01); H05K 3/328 (2013.01); H05K 3/4007 (2013.01); *H05K 2201/10098* (2013.01)

(58) Field of Classification Search
CPC ......... G06K 19/0775; G06K 19/07745; G06K 19/07747
USPC .......................................... 235/492
See application file for complete search history.

(56) References Cited

U.S. PATENT DOCUMENTS

| 7,629,694 | B2 | 12/2009 | Mouttet |
| 8,049,669 | B2* | 11/2011 | Yamazaki ........ G06K 19/07728 343/700 MS |
| 8,978,452 | B2* | 3/2015 | Johnson ............... G01N 27/223 340/604 |
| 9,595,501 | B1* | 3/2017 | Neuman ................. H01L 24/49 |
| 9,681,996 | B2* | 6/2017 | Prioleau .................. A61F 13/42 |
| 2004/0061660 | A1 | 4/2004 | Yoshida et al. |
| 2010/0181381 | A1* | 7/2010 | Carrender .......... G06K 19/0723 235/488 |
| 2014/0061314 | A1 | 3/2014 | Chan et al. |
| 2015/0248606 | A1* | 9/2015 | Li ..................... G06K 19/0739 235/492 |

OTHER PUBLICATIONS

"3M Science. Applied to Life" (Apr. 2017).*
(Continued)

*Primary Examiner* — Seung Lee
(74) *Attorney, Agent, or Firm* — Crawford Maunu PLLC

(57) ABSTRACT

A disclosed transponder arrangement includes a water soluble backing having first and second major surfaces. A layer of pressure sensitive adhesive (PSA) has a third major surface and a fourth major surface. The fourth major surface is directly adhered to the first major surface of the water soluble backing. One or more metal foil pads are attached directly on the third major surface of the layer of PSA. Electrically conductive round wire is attached directly on the third major surface of the layer of PSA. The wire has a round cross-section and one or more portions directly connected to the metal foil pad(s) with weld joint(s). An RF transponder is attached directly on the third major surface of the first layer of PSA and is electrically connected to the one or more portions of the round wire by bond wire(s).

15 Claims, 7 Drawing Sheets

(56) References Cited

OTHER PUBLICATIONS

Kellomaki et al., "Toward Washable Wearable Antenna: A Comparison of Coating Materials for Screen-Printed Textile-Based UHF RFID Tags," International Journal of Antennas and Propagation, vol. 2012, Article ID 476570, pp. 11 (2012).

Tsolis et al., "Embroidery and Related Manufacturing Techniques for Wearable Antennas: Challenges and Opportunities," Electronics, 3(2):314-338 (2014).

* cited by examiner

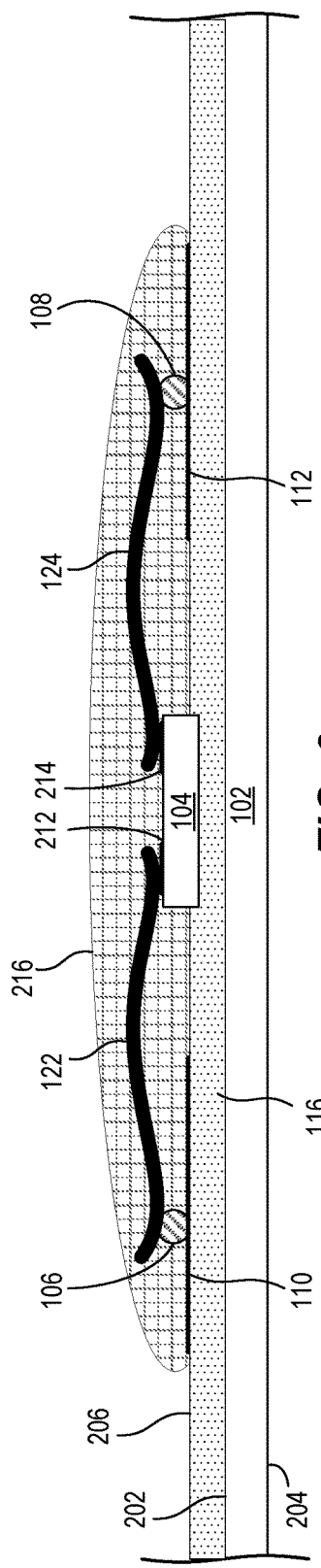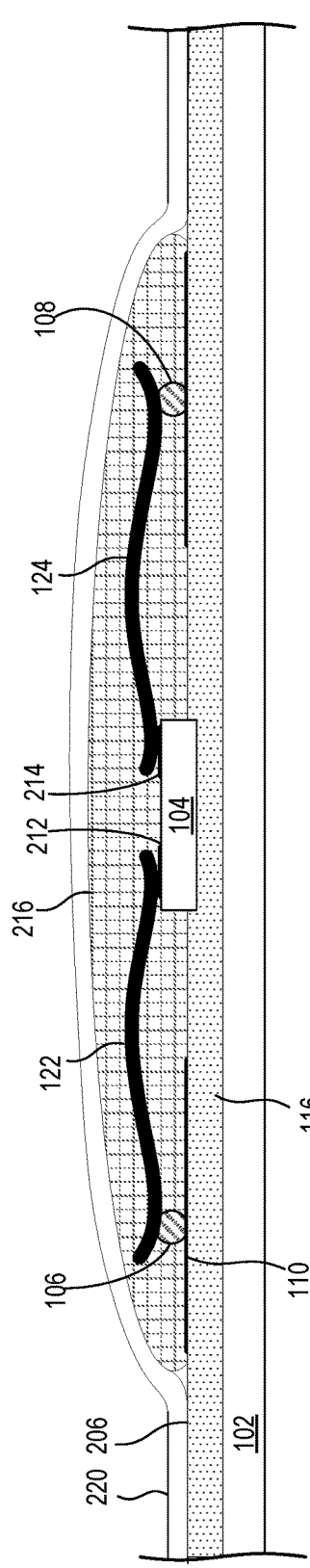

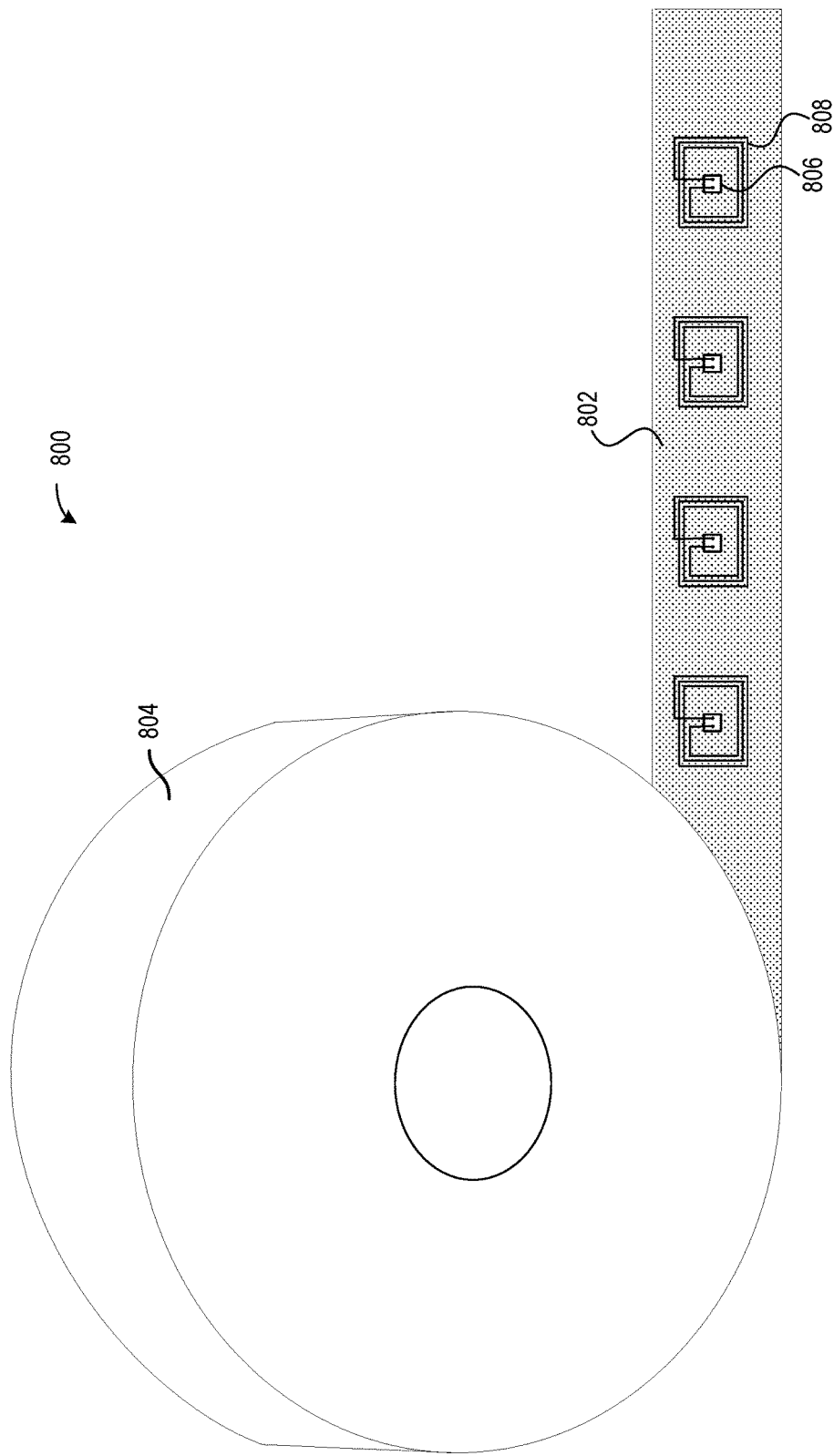

TRANSPONDER WIRE BONDED TO ROUND WIRE ON ADHESIVE TAPE HAVING A WATER-SOLUBLE BACKING

FIELD OF THE INVENTION

The disclosure describes wire bonding an RF transponder to round wiring on adhesive tape having a water-soluble backing.

BACKGROUND

There are a number of applications in which electronics are attached to various articles. The electronics may provide a function that is ancillary to the function of the article or work in conjunction with the article to provide a desired function. Radio frequency (RF) transponders and near-field communications are examples of such applications.

RFID applications vary from inventory control to traffic management to pet identification. RFID systems generally include readers and tags. RFID tags are affixed to the articles to be tracked, and the RFID reader emits a signal to activate the RFID tag. The RFID tag may respond by reading data from a memory and emitting a signal with the desired information for the RFID reader. Near-field communication tags are expanding RF applications beyond identification to data gathering applications.

For some applications, RF transponders and associated wiring are attached to a flexible substrate. Prior to mounting the electronic device, wiring patterns may be formed on the substrate using a print-and-etch process to construct the antenna.

Making RF transponder arrangements on a flexible substrate may be prohibitively expensive for some applications. The expense is attributable in part to the print-and-etch processes used in creating the wiring pattern. Expensive chemicals are required for print-and-etch processes, and hazardous waste is a byproduct.

SUMMARY

A transponder arrangement is provided in one implementation. The transponder arrangement includes a water soluble backing having first and second major surfaces. The first major surface is opposite the second major surface. A layer of pressure sensitive adhesive (PSA) has a third major surface and a fourth major surface. The third major surface is opposite the fourth major surface, and the fourth major surface is directly adhered to the first major surface of the water soluble backing. One or more metal foil pads are attached directly on the third major surface of the layer of PSA layer. Electrically conductive round wire is attached directly on the third major surface of the layer of PSA. The wire has a round cross-section and one or more portions directly connected to the one or more metal foil pads with one or more weld joints, respectively. An RF transponder is attached directly on the third major surface of the first layer of PSA and is electrically connected to the one or more portions of the round wire by one or more bond wires, respectively.

A method of making a circuit arrangement includes attaching first and second metal foil pads to a layer of pressure sensitive adhesive (PSA) that is disposed on a water soluble backing. A radio frequency (RF) transponder is attached to the layer of PSA proximate the first and second metal foil pads, and antenna wire is attached to the layer of PSA. The antenna wire has a round cross section and first and second portions disposed over the first and second metal foil pads, respectively. The method further includes welding the first and second portions of the antenna wire to the first and second metal foil pads, respectively, and wire bonding the electronic device to the first and second portions of the antenna wire making first and second wire bond joints between first and second bond wires and the first and second portions of the antenna wire, respectively.

The above summary is not intended to describe each disclosed embodiment. The figures and detailed description that follow provide additional example embodiments.

BRIEF DESCRIPTION OF THE DRAWINGS

Other aspects and advantages will become apparent upon review of the Detailed Description and upon reference to the drawings in which:

FIG. 2 shows a cross section of a portion of the RF transponder arrangement of FIG. 1 taken in direction 2;

FIG. 3 shows the structure of FIG. 2, with an added release liner;

FIG. 10 shows a roll of RF transponder arrangements according to another implementation.

DETAILED DESCRIPTION

Figure 1:
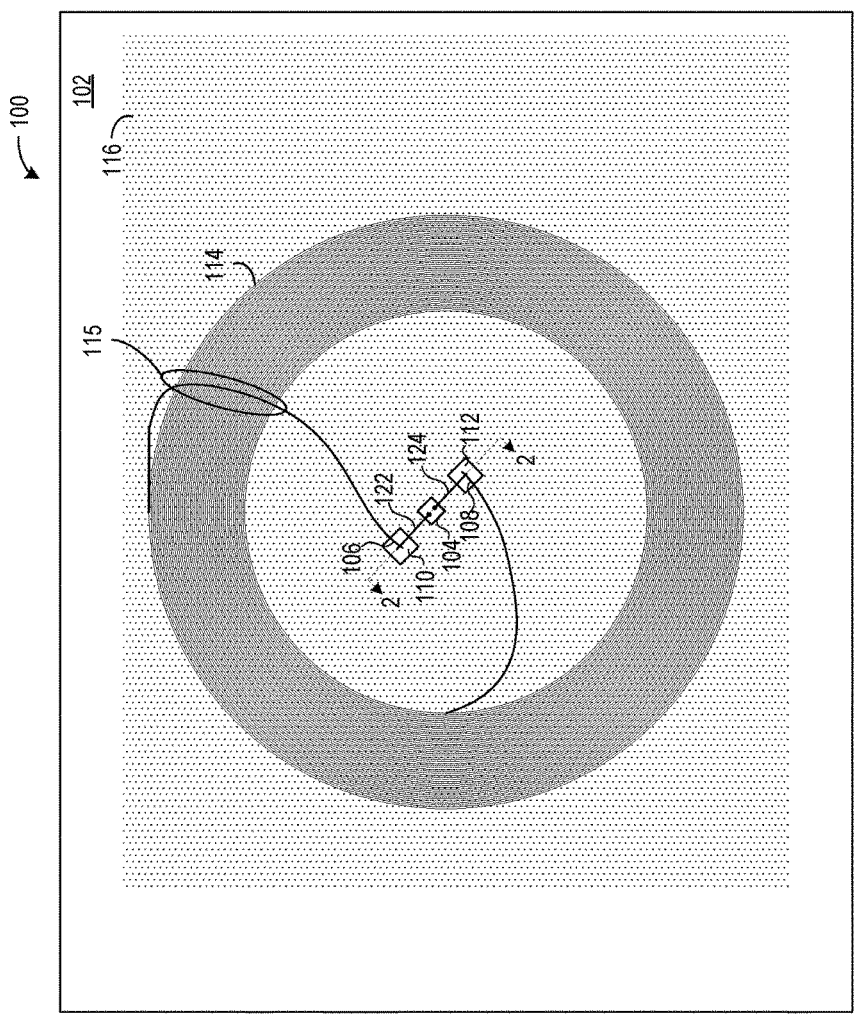
FIG. 1 shows an example of an RF transponder arrangement.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Terms such as over, under, top, bottom, above, below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

In the disclosed structures, RF transponder arrangements, LED-based lighting apparatuses, and other circuit arrangements of electronic devices are constructed using round wire rather than printed-and-etched patterns of conductive material for wiring the electronic devices. "Wire" as used herein does not refer to printed or printed-and-etched patterns of conductive material. Rather, as used herein, wire refers to one or more strands of conductive material that have been made, for example, by drawing the conductive material through draw plates. Using a fine gauge copper wire to make antennas or provide power to LEDs eliminates the use of environmentally hazardous chemicals as would be required for printing and etching. Though challenges are presented in connecting the wire to electronic devices such as RF transponders, LEDs, or discrete components, the disclosed approaches simplify making the connections. Electronic devices as used herein refers to integrated circuit (IC) components as well as to discrete components such as capacitors, resistors, etc.

The disclosed structures and methods provide minimally obtrusive RF transponder arrangements that can be constructed using fewer environmentally hazardous chemicals than in prior approaches. The disclosed approaches use round wire rather than printed-and-etched patterns of conductive material for wiring the RF transponder arrangements. "Wire" as used herein does not refer to printed or printed-and-etched patterns of conductive material. Rather, as used herein, wire refers to one or more strands of conductive material that have been made, for example, by drawing the conductive material through draw plates. Using a fine gauge copper wire eliminates the use of environmentally hazardous chemicals as would be required for printing and etching. However, additional challenges are presented in connecting the wire to electronic devices such as RF transponders.

Automated wire bonding machines may be used to construct wire bonds between the antenna and the RF transponder. With fine gauge wire as the antenna, the wire bonding machine may have difficulty locating the desired portions of the wiring. Distinguishing a strand of the fine gauge wire from the adhesive that binds the antenna wire to the substrate based on imagery gathered by the wire bonding machine may be problematic. In addition, even if the wire bonding machine is properly positioned, making a durable wire bond on the fine gauge wire presents problems. The fine gauge and rounded surface of the wire make an unstable bonding surface and are not conducive to making a strong joint between the wire and bond wire. The disclosed approaches produce a structurally sound wire bond from the antenna to the RF transponder.

In addition to providing environmentally friendly wiring and strong wire bonds, the disclosed RF transponder arrangements are flexible and minimally obtrusive, making the arrangements suitable for a variety of applications. The disclosed RF transponder arrangements include a water-soluble backing for an adhesive layer, with the RF transponder and antenna wire attached to the adhesive layer. The resulting structure can withstand millions of flexes and has a thin profile.

In one implementation, a transponder arrangement includes a water soluble backing having an adhesive layer, and antenna wire and RF transponder disposed on the adhesive layer. Metal foil pads are attached to the PSA layer. The metal pads may be copper or aluminum, depending on application requirements. The antenna wire has a round cross-section and portions of the antenna wire are directly connected to the metal foil pads with weld joints.

The RF transponder is connected to the antenna wire, either directly or indirectly, by bond wires. In a direct connection, one end of the bond wire is connected to the RF transponder and the other end of the bond wire is connected to the portion of the wire that is connected to the metal foil pad. In an indirect connection, one end of the bond wire is connected to the RF transponder, and the other end of the bond wire is connected to the metal foil pad.

Each metal foil pad serves as a connection site between the round antenna wire and the RF transponder, providing a stable surface to which the antenna wire and bond wires can be connected. Prior approaches have used lead frames to connect electronic devices to conductors. However, the lead frames introduce additional bulk to the structure, which may be undesirable for some applications. The metal foil pads eliminate the need for lead frames, thereby reducing the profile of the structure.

The structure having round antenna wire attached to a layer of PSA and water soluble backing provides a substantial reduction in cost over structures having printed-and-etched wiring patterns. The structure is amenable to welding and wedge bonding, which eliminates environmental concerns associated with lead-based solders and costs and durability associated with lead-free solders. As described below, various aspects of the structure make the structure both flexible and durable.

FIG. 1 shows an example of an RF transponder arrangement 100. The RF transponder arrangement includes a water soluble backing 102 having an adhesive layer 116, an RF transponder 104, and coil antenna wire 114. The particular functions of the RF transponder are application dependent. Example applications include RFID and near-field communications. In general, the transponder modulates and demodulates an RF signal and processes information according to the application. The RF transponder may be packaged or unpackaged (a "bare die") according to application requirements. The water soluble backing can be poly vinyl alcohol or other application-suitable water soluble backing.

Rather than using expensive print-and-etch techniques to make antenna wiring for the RF transponder, the antenna wire is attached to the layer of PSA on a water soluble backing. The wire may be bare wire or wire encased in a dielectric jacket. The wire may be made of any material suitable for the application. The antenna wire 114 may be a fine gauge, round (round cross-section), bare wire. For example, 44 gauge (AWG) copper or silver-coated copper wire has been found to be suitable for some applications. However, different gauges may be suitable for different applications. For an implementation having bare antenna wire, an insulating bridge (not shown) may be disposed between intersecting portions 115 of the antenna wire.

The adhesive may be pressure sensitive, which keeps the wire in place as the antenna pattern is formed on the substrate. It will be appreciated that other types of adhesives may be suitable for different applications. The RF transponder 104 may be attached to the substrate 102 using the same adhesive as is used for the antenna wire.

Metal foil pads 110 and 112 are attached to the adhesive layer 116 and located proximate the RF transponder 104. The distance separating each of pads 110 and 112 and the RF transponder is suitable for wire bonding of the RF transponder to the end portions of the antenna wire. The pads may be copper or aluminum and of a thickness suitable for wedge bonding and welding. In one implementation, the metal foil pads are 1 mm$^2$ and formed from 10 mil copper foil.

Antenna wire 114, which is a single coiled wire segment in the example, has portions for connecting to bond wires 122 and 124. In the coil antenna pattern, connections to the RF transponder are made at end portions 106 and 108 of the antenna wire. For other antenna patterns, the connection to the RF transponder may be at portions between the end portions of the antenna wire (e.g., FIG. 8). End portions 106 and 108 of the antenna wire are connected to pads 110 and 112 by weld joints. In one implementation, the end portions 106 and 108 are compressed against the pads 110 and 112 prior to welding, enhancing strength of the subsequently formed weld joint and forming a flat area of contact for wire bonding the antenna to the RF transponder.

FIG. 2 shows a cross section of a portion of the RF transponder arrangement 100 of FIG. 1 taken in direction 2. The water soluble backing 102 has a first major surface 202 and a second major surface 204 opposite the first major surface. One major surface of the adhesive layer 116 is directly adhered to the first major surface 202 of the substrate.

RF transponder 104, metal foil pads 110 and 112 and the wire (FIG. 1, #114) are directly adhered to the major surface 206 of the adhesive layer 116. It will be recognized that the portions of the wire 114 that are directly adhered to the adhesive layer are not shown in FIG. 2 as the cross section shows only end portions 106 and 108 of the wire 114. The end portions 106 and 108 of the wire are connected to the metal foil pads 110 and 112, respectively, with weld joints. The weld joints may be formed by friction or ultrasonic welding, for example.

The RF transponder 104 is electrically connected to the portions 106 and 108 of the antenna wire by bond wires 122 and 124, respectively. In the structure of FIG. 2, the bond wires are directly connected to the wire portions 106 and 108. Bond wire 122 connects bond pad 212 to wire portion 106, and bond wire 124 connects bond pad 214 to wire portion 108. Wedge bonding or ball bonding may be used to connect the bond wires, depending on application requirements and restrictions.

The metal foil pads 110 and 112 provide stable and visible structures that are dedicated to connecting the bond wires 122 and 124 to the wire portions 106 and 108. The metal foil pad 110 is only directly connected to wire portion 106, and metal foil pad 112 is only directly connected to wire portion 108.

A polymer conformal coating 216, which is sometimes referred to as a "glob-top," covers the RF transponder 104, bond wires 122 and 124, metal foil pads 110 and 112, and wire portions 106 and 108. The polymer conformal coating may be an epoxy, acrylic, polyurethane, or silicone, depending on application requirements. The transponder arrangement 100 of FIG. 1 does not show the polymer conformal coating in order to avoid obscuring elements of the arrangement.

FIG. 3 shows the structure of FIG. 2, with an added release liner 220. The release liner is disposed directly on the surface 206 of the PSA layer 116 and is separable from the PSA layer, which allows the RF transponder arrangement 100 (FIG. 1) to be attached to a desired object.

Figure 4:
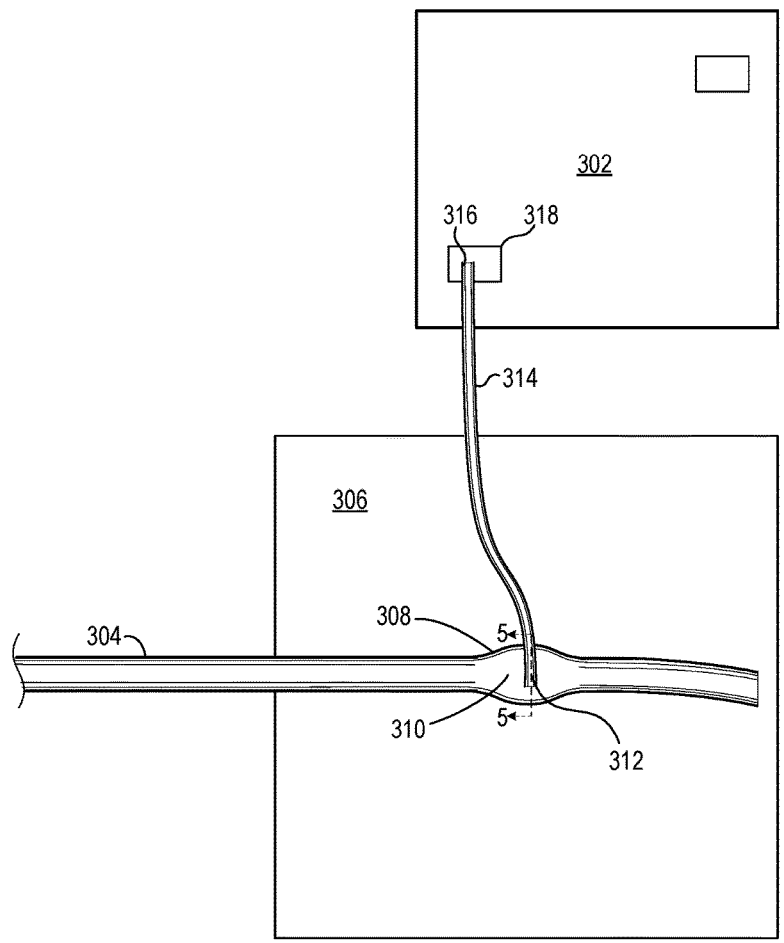
FIG. 4 shows a plan view of an electronic device wire bonded to a portion of round wire that is connected to a metal foil pad.

FIG. 4 shows a plan view of an RF transponder 302 wire bonded to a portion of round antenna wire 304 that is connected to a metal foil pad 306. The RF transponder 302, wire 304, and metal foil pad 306 are representative of the RF transponder 104, wire 114, and metal foil pad 110 of FIG. 1, for example.

A portion 308 of the antenna wire 304 that is disposed on the metal foil pad 306 is compressed, forming a flat contact area 310 that is amenable to wire bonding. In addition to forming a contact area for wire bonding, compression of the intersection mechanically interlocks a portion of the wire 304 with the metal foil pad, thereby providing a stable target for welding the wire at the flat contact area 310 to the metal foil pad.

Once the wire 304 has been welded to the metal foil pad 306 at the flat contact area 310, the electronic device may be wire bonded to the flat contact area 310. One end 312 of the bond wire 314 is bonded to flat contact area 310, and the other end 316 of the bond wire is bonded to the contact pad 318 on the electronic device 302. The bond wire may be wedge bonded to provide a low profile. In other applications, the bond wires may be ball bonded. The weld joint of the flat contact area 310 to the metal foil pad 306 and the wire bond to the flat contact area 310 may be replicated for other portions of the antenna wire 304 or for other portions of other wire segments.

Figure 5:
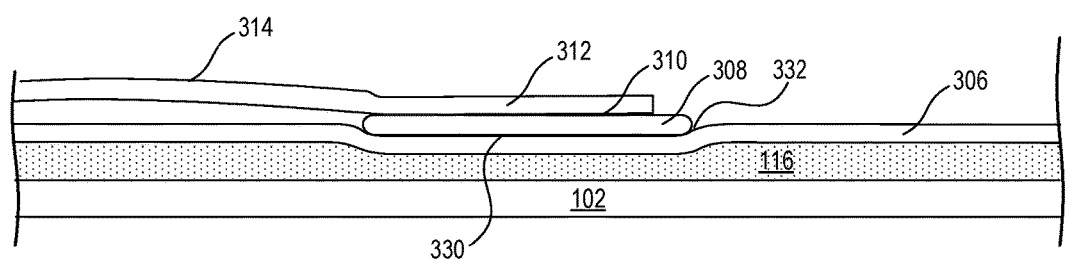
FIG. 5 shows a cross section of a portion of the structure of FIG. 4 taken in direction 7.

FIG. 5 shows a cross section of a portion of the structure of FIG. 4 taken in direction 5. The compressed portion 308 of the wire 304 does not have a round cross section as do other portions of the wire. Rather, the compressed portion has a first flat contact area 310 wire bonded to bond wire 314, and a second flat contact area 330 that is welded to the metal foil pad 306. Compression of wire portion 308 creates a recessed portion 332 in the metal foil pad 306. The compressed portion 308 within the recessed portion 332 provides a stable target for welding the wire to the metal foil pad, which might otherwise be problematic.

Figure 6:
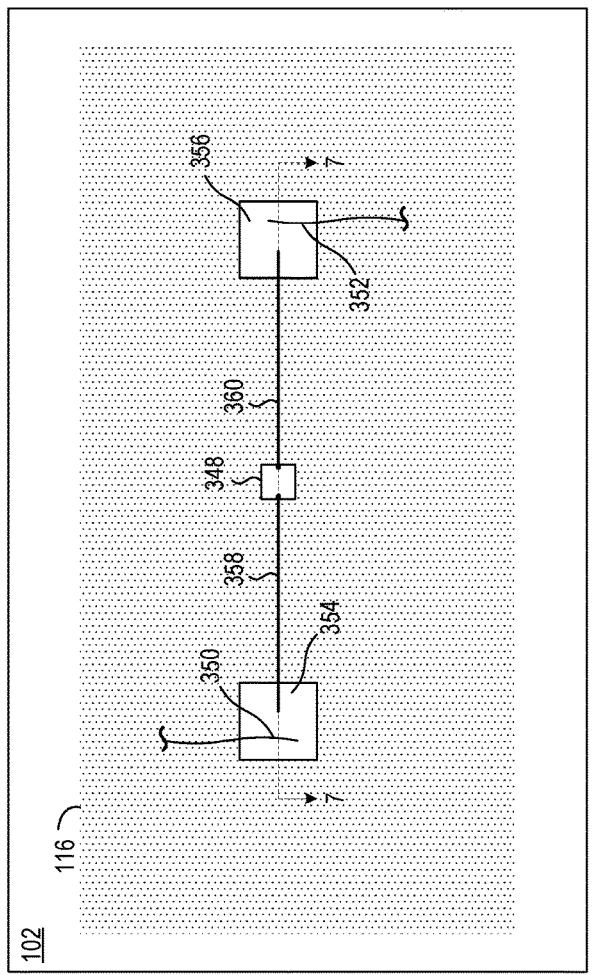
FIG. 6 shows a plan view of an alternative connection between an electronic device and round wire.

FIG. 6 shows a plan view of an alternative connection between an RF transponder 348 and round antenna wire. In the arrangement of FIG. 6, the bond wires are directly connected to the metal foil pads rather than to the round antenna wire. Portions 350 and 352 of the round antenna wire are welded to metal foil pads 354 and 356, respectively. Bond wires 358 and 360 are wire bonded directly to the metal foil pads 354 and 356, respectively. Each metal foil pad is directly electrically connected to only a wire portion and to the bond wire. The indirect attachment of the bond wires to the wire portions 350 and 352 may be used in place of the direct attachment approaches shown in FIGS. 1-5.

Figure 7:
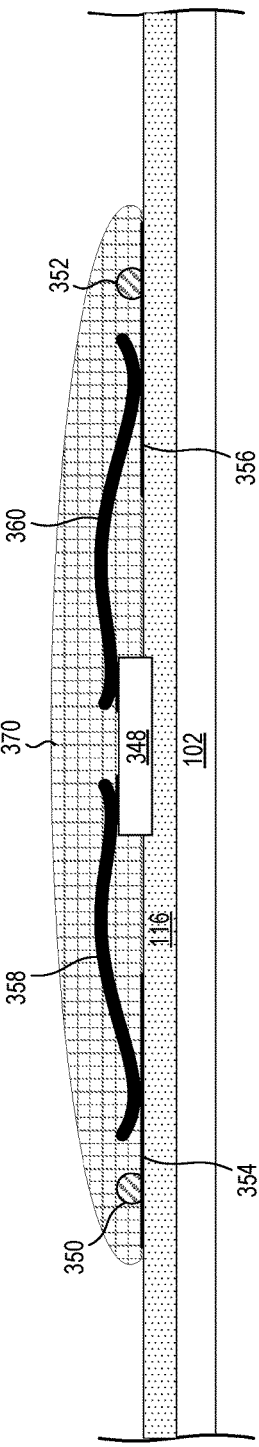
FIG. 7 shows a cross section of a portion of the structure of FIG. 8 taken in direction 9.

FIG. 7 shows a cross section of a portion of the structure of FIG. 6 taken in direction 7. A conformal coating 370 is shown similar to the conformal coating 216 of FIG. 2.

Figure 8:
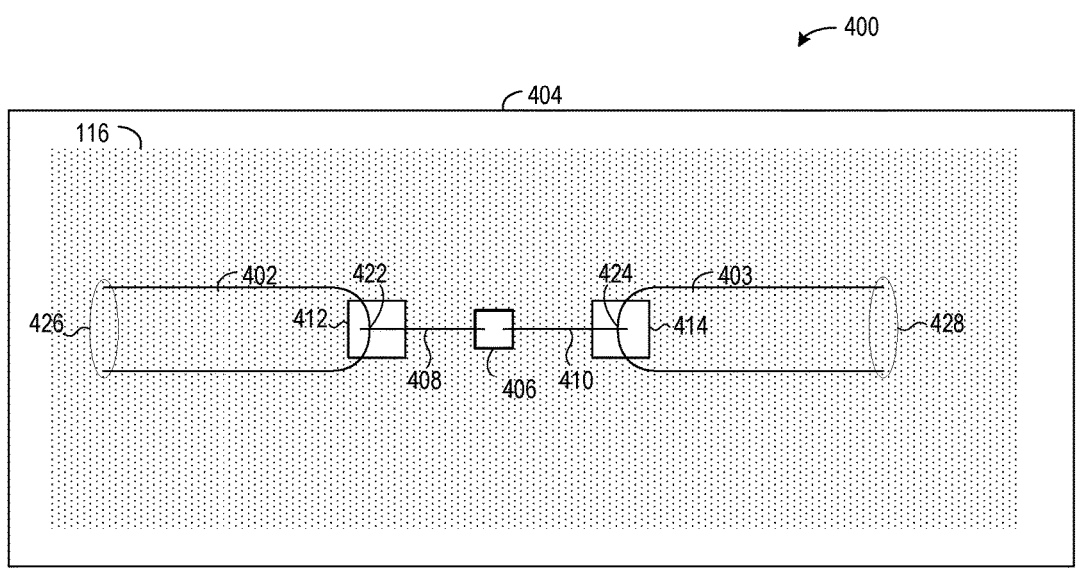
FIG. 8 shows an alternative antenna pattern and the connection of the antenna wires to the bond wires.

FIG. 8 shows an alternative antenna pattern and the connection of the antenna wire to the bond wires. The antenna wire includes wire segments 402 and 403. The wire bonds at portions of the antenna wire are between end portions of the antenna wire. It will be appreciated that in addition to the antenna patterns of FIGS. 1 and 8, the disclosed structures are adaptable for any of the many different antenna patterns known in the art to be suitable for RF transponder applications. As with the RF transponder arrangement 100 of FIG. 1, RF transponder arrangement 400 includes a water soluble backing 404 and an RF transponder 406. The antenna and RF transponder may be adhered to the water soluble backing as described for the RF transponder arrangement 100.

Metal foil pads 412 and 414 are attached to adhesive layer 116 and located proximate the RF transponder 406. Portions 422 and 424, which are between the end portions 426 and 428 of wire segments 402 and 403, are laid over the metal foil pads 412 and 414, respectively. The wire portions 422 and 424 are compressed as described above. The bond wires 408 and 410 connect the RF transponder 406 to flat contact areas (e.g., FIGS. 4, 5) at portions 422 and 424 of the wire segments 402 and 403.

Figure 9:
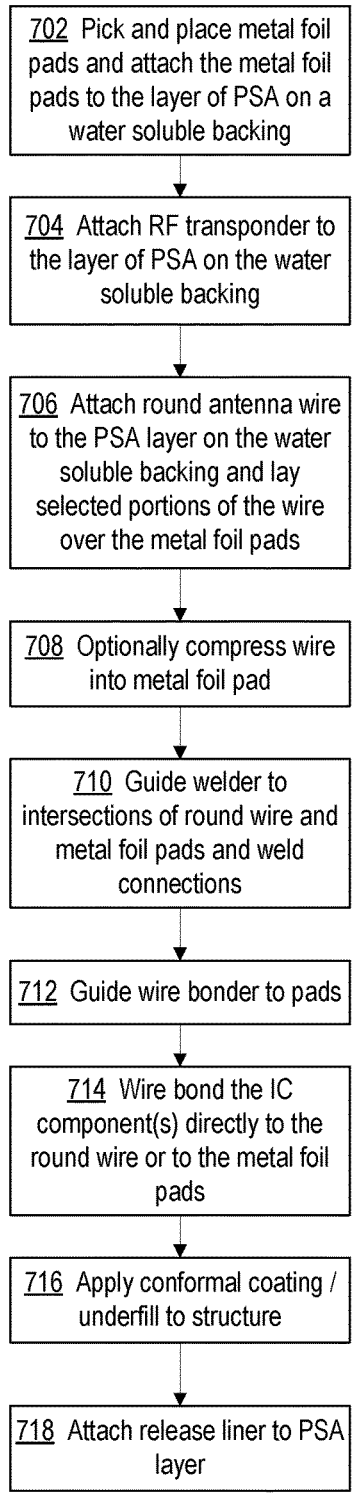
FIG. 9 is a flowchart of a process of making a circuit arrangement having an electronic device using wire bonding approaches to connect the electronic devices to round wire segments.

FIG. 9 is a flowchart of a process of making a circuit arrangement having an electronic device using wire bonding approaches to connect the electronic devices to round wire segments. Metal foil pads are picked and adhered to a PSA layer on a water-soluble backing at desired locations at block 702. One or more electronic devices are picked and adhered to the PSA layer at desired locations at block 704. The locations of the metal foil pads and electronic device(s) are according to application requirements. The water-soluble backing, PSA layer, metal foil pads, electronic device(s), and bond wire are as described above. The metal foil pads and electronic devices may be picked and placed on the PSA layer using known robotic equipment.

At block 706, one or more round wire segments are attached to the PSA. Selected portions of the round wire segment(s) pass over the metal foil pads. The wire segment(s) may implement a desired antenna pattern for an RF transponder or power and control wires for LEDs. The type of wire may be as described above.

At block 708, the portions of the wire segment(s) and the cross wires may be optionally compressed to form flat contact areas for wire bonding and create a stable target for welding the wire portions to the metal foil pads. In an example approach, the round wire portions may be compressed by robotic action. A robot may have an image sensor and processor for identifying portions of the wire that overlay the pads. Based on the imagery, a head unit may be positioned above a portion of the wire to be compressed. The head unit may include a pneumatically actuated piston having a cross section that is approximately the size of the diameter of the round wire. Once in position and at the desired height, the piston is driven by pneumatic force in a hammer action at the joint. The striking of the piston against the round wire portion forms a flat contact area for wire bonding and presses the flattened portion of the wire into a recess thereby formed in the metal foil pad.

At block 710, the compressed portions are welded to the metal foil pads. In one approach, the joints may be welded using an ultrasonic welder that is guided by digital imagery and robotic control.

The wire bonding head of a wire bonder is guided to the metal foil pads at block 712. The wire bonder may be imagery-based, using images of the metal foil pads and wire portions to position the wire bonding head. At block 714, the electronic device is electrically connected to round wire, either directly by a wire bond connection on the flat contact areas of the wire portions, or indirectly by a wire bond connection on the metal foil pad. The bond wires may be wedge bonded or ball bonded, depending on application requirements. In implementations in which insulated wire is used, the welding and wedge bonding at the intersections of the cross wires and wire segments effectively removes the dielectric material at the joints. Though blocks 702-714 are presented in a particular order, it will be recognized that the order of processing may vary according to implementation requirements.

At block 716, a conformal coating or an underfill is applied to the wire bonded circuit arrangement. The conformal coating may be as described above with reference to FIG. 2 and covers the metal foil pads, bond wires, and electronic device. A lower profile and flexible structure may be made by applying an acrylic underfill to the structure. The underfill is flexible, fills the gap between the bond wires and the PSA layer and covers the wire bond joints. If an underfill is used in the structure, a second PSA layer may be disposed over the first PSA layer and covering the electronic device, bond wires, round wire, and metal foil pads. A release liner is attached to the PSA layer at block 718.

FIG. 10 shows a roll of RF transponder arrangements according to another implementation. The roll 800 includes multiple RF transponder arrangements adhered to the adhesive layer 802 on a water soluble backing 804. Though not shown, a release liner, such as the release liner 602 shown in FIG. 6, can be disposed over the adhesive layer to prevent the adhesive layer from adhering to the surface of the water soluble backing opposite the surface having the adhesive layer when in the rolled form. Each transponder arrangement includes an antenna and an RF transponder. For example, one of the transponder arrangements includes RF transponder 806 and antenna 808. In each transponder arrangement, the antenna 808 is adhered directly to the adhesive layer 802. The RF transponder 806 may either be directly adhered to the adhesive layer or mounted on a strap (not shown), which is directly adhered to the adhesive layer. In combination with roll-to-roll manufacturing processes for constructing the roll 800, the water soluble backing adhesive layer, RF transponder, and antenna can be constructed and implemented as shown and described in FIGS. 1-7.

Although the figures illustrate circuit arrangements that include RF transponders and LEDs, it will be recognized that the disclosed approaches for wire bonding to round wire are similarly applicable to other electronic devices, such as other integrated circuit (IC) components or discrete components such as capacitors, resistors, etc.

The present invention is thought to be applicable to a variety of applications. Other aspects and embodiments will be apparent to those skilled in the art from consideration of the specification and practice of the circuits and methods disclosed herein. It is intended that the specification and illustrated embodiments be considered as examples only, with a true scope of the invention being indicated by the following claims.

What is claimed is:

1. A circuit arrangement, comprising:
   a water soluble backing having first and second major surfaces, the first major surface opposite the second major surface;
   a layer of pressure sensitive adhesive (PSA) having a third major surface and a fourth major surface, the third major surface opposite the fourth major surface, and the fourth major surface directly adhered to the first major surface of the water soluble backing;
   one or more metal foil pads attached directly on the third major surface of the layer of PSA;
   electrically conductive round wire attached directly on the third major surface of the layer of PSA, the wire having a round cross-section and one or more portions directly connected to the one or more metal foil pads with one or more weld joints, respectively; and
   an RF transponder attached directly on the third major surface of the layer of PSA and electrically connected to the one or more portions of the round wire by one or more bond wires, respectively.

2. The circuit arrangement of claim 1, wherein the one or more bond wires are directly connected to the one or more portions of the round wire.

3. The circuit arrangement of claim 1, wherein the one or more bond wires are directly connected to the one or more metal foil pads, respectively.

4. The circuit arrangement of claim 1, wherein each of the one or more portions of round wire have flat contact areas with the respective one of the one or more metal foil pads.

5. The circuit arrangement of claim 1, wherein:
   each of the one or more portions of round wire has a flat area of contact with the respective one of the one or more metal foil pads; and
   each of the one or more portions of round wire has a flat area of contact to which the respective one of the one or more bond wires is directly connected.

6. The circuit arrangement of claim 1, wherein each of the one or more metal foil pads is directly electrically connected to only one of the one or more portions of round wire.

7. The circuit arrangement of claim 1, wherein each of the one or more metal foil pads is directly electrically connected to only one of the one or more portions of round wire and one of the one or more bond wires.

8. The circuit arrangement of claim 1, further comprising a polymer conformal coating that covers the one or more metal foil pads and the RF transponder.

9. The circuit arrangement of claim 1, further comprising a release liner disposed directly on the layer of PSA.

10. A method of making a circuit arrangement, comprising:
   attaching first and second metal foil pads to a layer of pressure sensitive adhesive (PSA) that is disposed on a water soluble backing;
   attaching a radio frequency (RF) transponder to the layer of PSA proximate the first and second metal foil pads;
   attaching antenna wire to the layer of PSA, the antenna wire having a round cross section and first and second portions disposed over the first and second metal foil pads, respectively;
   welding the first and second portions of the antenna wire to the first and second metal foil pads, respectively; and
   wire bonding the RF transponder to the first and second portions of the antenna wire making first and second wire bond joints between first and second bond wires and the first and second portions of the antenna wire, respectively.

11. The method of claim 10, further comprising:
   compressing each of the first and second portions of the antenna wire into flat contact areas with the first and second metal foil pads, respectively; and
   wherein the wire bonding includes making the first and second wire bond joints between the first and second bond wires and compressed parts of the first and second portions of the antenna wire.

12. The method of claim 10, wherein the first and second metal foil pads are directly electrically connected to only the first and second portions, respectively, of the antenna wire.

13. The method of claim 10, further comprising forming a polymer conformal coating that covers the first and second metal foil pads and the RF transponder.

14. The method of claim 13, further comprising attaching a release liner directly on the layer of PSA and over the polymer conformal coating.

15. The method of claim 10, wherein the water soluble backing includes poly vinyl alcohol.

* * * * *